United States Patent [19]

Economou et al.

[11] Patent Number: 5,103,102

[45] Date of Patent: Apr. 7, 1992

[54] LOCALIZED VACUUM APPARATUS AND METHOD

[75] Inventors: Nicholas P. Economou, Lexington; David Edwards, Jr., Hamilton; Nicholas Guarino, Arlington, all of Mass.

[73] Assignee: Micrion Corporation, Peabody, Mass.

[21] Appl. No.: 315,732

[22] Filed: Feb. 24, 1989

[51] Int. Cl.[5] .................. H01J 37/18; H01J 33/02
[52] U.S. Cl. .................. 250/492.2; 250/440.11; 250/441.11
[58] Field of Search ............ 250/492.2 R, 309, 441.1, 250/440.1, 492.21, 492.3; 219/121.33, 121.49, 121.51

[56] References Cited

U.S. PATENT DOCUMENTS

| | | | |
|---|---|---|---|
| 3,585,348 | 6/1971 | Eckstein | 219/121 |
| 3,904,505 | 9/1975 | Aisenberg | 204/298 |
| 3,930,155 | 12/1975 | Kanamata et al. | 250/309 |
| 3,976,511 | 8/1976 | Johnson | 250/492.3 |
| 4,118,042 | 10/1978 | Booth | 277/226 |
| 4,193,003 | 3/1980 | Blanchard et al. | 250/492.2 |
| 4,496,449 | 1/1985 | Rocca et al. | 250/492.2 |
| 4,524,261 | 6/1985 | Petric et al. | 219/121 EL |
| 4,584,479 | 4/1986 | Kanomata et al. | 250/309 |
| 4,605,566 | 8/1986 | Matsui et al. | 250/492.2 |
| 4,607,167 | 8/1986 | Petric | 250/492.2 |
| 4,617,237 | 10/1986 | Gupta et al. | 427/53.1 |
| 4,698,236 | 10/1987 | Kellogg et al. | 250/492.2 |
| 4,720,633 | 1/1988 | Nelson | 250/310 |
| 4,837,443 | 6/1989 | Young et al. | 250/441.1 |
| 4,908,226 | 3/1990 | Kubena et al. | 250/492.3 |

FOREIGN PATENT DOCUMENTS 0106511 4/1984 European Pat. Off. .
0241190 10/1987 European Pat. Off. .
0777426 6/1957 United Kingdom .
82/02235 7/1982 World Int. Prop. O. .

OTHER PUBLICATIONS

Characteristics of Selective Deposition of Metal Films Using Focused Ion Beams; Kenji Gamo, Nobuyuki Takakura, Daisuke Takehara and Susumu Namba, 1984, pp. 31–34.

E. Donath, "Differential Pumping of a Narrow Slot", *Journal of Vacuum Science*, pp. 271–274.

A. H. Shapiro, "Optimum Design of Pumping System for Maintaining Vacuum in a Chamber Open to the Atmosphere Through an Aperture", *Vaccum*, 1963, pp. 83–87.

Primary Examiner—Jack I. Berman
Assistant Examiner—Kiet T. Nguyen
Attorney, Agent, or Firm—Lahive & Cockfield

[57] ABSTRACT

An apparatus for generating a localized, non-contact vacuum seal at a selected process region of a workpiece surface includes a vacuum body with a workpiece-facing surface having a plurality of concentric grooves and a central bore thorugh which a process energy beam can be transmitted. A method of generating a localized vacuum seal includes placing the vacuum body into selected proximity with the process region of the workpiece surface, and differentially evacuating the grooves, thereby defining differentially pumped vacuum chambers which reduce the influx of atmospheric particles to the process region. A selected control gas can be introduced into a vacuum body groove to further reduce the influx of atmospheric particles to the process region, and selected process gases can be introduced into the vacuum body to react with the process beam.

37 Claims, 2 Drawing Sheets

LOCALIZED VACUUM APPARATUS AND METHOD

BACKGROUND OF THE INVENTION

This invention relates generally to vacuum apparatus and methods, and, more particularly, relates to apparatus and methods for generating a localized, noncontact vacuum seal between a vacuum apparatus and the surface of a workpiece.

A wide range of processes, for photolithography and repair of photomasks, integrated circuits, TV picture tubes, and liquid crystal display (LCD) structures, utilize focused beams such as electron beams, ion beams or laser beams. Conventional focused beam repair systems require that the workpiece be placed inside an evacuated chamber to reduce the number of atmospheric particles which scatter the beam and reduce resolution. In the case of electron beam or ion beam systems, evacuation is required because the electron gun itself must be in a region of very low pressure, on the order of $10^{-6}$ mmHg.

At the conclusion of the repair stage, the chamber is opened and the workpiece is removed. A new workpiece is inserted, and the cycle repeats. The requirement of repeatedly evacuating the chamber adds cost and complexity, and is time consuming, sharply reducing the throughput of focused beam repair systems.

It is known that a localized, non-contact vacuum seal can be created between an apparatus and a workpiece surface, using a series of differentially pumped apertures. The basis of differential pumping lies in the introduction of resistances in the path of gas flow between pumping stages. Large pressure ratios can be achieved if several such stages are used in succession. The mathematical basis for non-contact vacuum devices using differential pumping is described in E. Donath, "Differential Pumping of a Narrow Slot," *Journal of Vacuum Science*, incorporated herein by reference; and A. H. Shapiro, "Optimum Design of Pumping System for Maintaining Vacuum in a Chamber Open to the Atmosphere Through an Aperture," *Vacuum*, 1963, incorporated herein by reference.

The Donath publication discusses experimental results on differential pumping of a narrow rectangular slot open to the atmosphere at the inlet side, and the pumping requirements for achieving pressures on the order of $10^{-6}$ torr at the terminus of the slot.

The Shapiro publication discusses a vacuum system for allowing electron beam welding without a window separating the electron gun and the workpiece.

Differential pumping and localized vacuum seals are also disclosed in the following U.S. Pat. Nos.: 3,904,505, Aisenberg. 4,118,042, Booth. 4,524,261, Petric et al. 4,720,633, Nelson.

Aisenberg discloses apparatus for depositing a thin film upon a base substrate, the apparatus including a differentially pumped vacuum chamber.

Booth discloses an air bearing vacuum seal assembly including a two-stage differential pumping arrangement for maintaining a selected pressure gradient between a vacuum region and an air cushion region.

Petric et al discloses localized vacuum apparatus having elements for defining plural concentric vacuum chambers, including a central vacuum zone through which a particle beam is directed. Internal channels connect the vacuum chambers to individual vacuum pumps, and the chambers are differentially pumped to form a noncontact vacuum seal between the device and a workpiece.

Nelson discloses scanning electron microscope apparatus including an aperture column having a series of differentially pumped pressure zones.

Differentially pumped vacuum devices, however, are typically bulky in radial and axial dimension—i.e., in the dimensions perpendicular to and parallel to the beam, respectively—, and therefore cannot be utilized for processing near the edges of a semiconductor wafer or LCD structure.

Moreover, the construction of differentially pumped devices has heretofore required the assembly of numerous mechanical parts, thereby increasing cost and complicating the task of maintaining critical mechanical tolerances in the axial dimension. This dimension is especially important because it is determinative of the gap separating the workpiece surface and the workpiece-facing surface of the localized vacuum apparatus. If the gap is excessive, vacuum is reduced due to increased influx of atmospheric particles. An insufficient gap, conversely, increases the risk of contact with, and resultant damage to, the workpiece surface. Accordingly, tolerances in the axial dimension are critical in construction of localized vacuum apparatus.

Additionally, differentially pumped devices typical of the prior art provide no elements for delivering process gases for deposition on, or etching of, a substrate.

It is accordingly an object of the invention to provide localized vacuum apparatus and methods adapted for use with particle beam or laser beam apparatus, and which provide a high degree of isolation of the process zone from atmospheric particles.

It is another object of the invention to provide localized vacuum apparatus and methods which can achieve high vacuum levels in a central process zone.

It is a further object of the invention to provide localized vacuum apparatus which is compact in radial and axial dimensions, and which can be dynamically and controllably positioned, in three orthogonal axes, at selected positions over the workpiece surface.

It is another object of the invention to provide localized vacuum apparatus and methods for the introduction of selected process gases for providing selected reactions in the process zone.

It is yet another object of the invention to provide localized vacuum apparatus which is simple and inexpensive to construct with closely controlled mechanical tolerances.

Other general and specific objects of the invention will in part be obvious and will in part appear hereinafter.

SUMMARY OF THE INVENTION

The foregoing objects are attained by the invention, which provides apparatus and methods for employment with lithography and repair devices utilizing laser beams, particle beams, or other energy beams (hereinafter generically referred to as "energy beams"). In accordance with one aspect of the invention, the apparatus generates a localized, non-contact vacuum seal at a selected process region of a workpiece surface, and includes a vacuum body having a workpiece-facing surface with a plurality of concentric grooves and a central bore through which a process energy beam, such as a laser, can be transmitted.

Actuator elements are provided for positioning the vacuum body in selected proximity with the process region of the workpiece surface, and vacuum pump elements are provided for differentially evacuating the vacuum body grooves. The grooves thereby define differentially pumped vacuum chambers which reduce the influx of atmospheric particles to the process region.

In another aspect of the invention, the apparatus includes detectors for monitoring gas pressure in a selected groove to measure the gap between the workpiece-facing surface and the workpiece surface; and a position controller, which can include a microprocessor, responsive to the detected gas pressure, for controlling the actuator elements to maintain a selected gap between the workpiece-facing surface and the workpiece surface. The vacuum body can be constructed by machining the grooves into a selected surface of a monolithic metallic body, and the conduits can be constructed by machining respective bores through the vacuum body into respective ones of the grooves.

In a further aspect of the invention, control gas source elements are provided for introducing a selected control gas into a vacuum body groove, to further reduce the influx of atmospheric particles to the process region.

The apparatus can include process or reaction gas elements for introducing a selected photolytically or pyrolytically reactive gas mixture into a selected groove to migrate into, and react in, the path of the energy beam, to deposit a selected reaction product on the workpiece surface. This gas mixture can include a carbon monoxide carrier component and a cobalt oxide reaction component for photolytically or pyrolytically reacting to deposit an electrically conductive or insulative, optically opaque or transparent layer on the workpiece surface.

A further aspect of the invention includes the steps of differentially evacuating a vacuum body having a workpiece-facing surface with a plurality of concentric grooves defining vacuum chambers, positioning the vacuum body in selected proximity to a workpiece surface to generate a vacuum seal, and introducing a selected control gas into at least one groove to further reduce the influx of atmospheric particles. The invention can also include the step of introducing selected process gas mixtures for reacting in the path of an energy beam transmitted through the vacuum body.

The invention will next be described in connection with certain illustrated embodiments; however, it should be clear to those skilled in the art that various modifications, additions and subtractions can be made without departing from the spirit or scope of the claims.

BRIEF DESCRIPTION OF THE DRAWINGS

For a fuller understanding of the nature and objects of the invention, reference should be made to the following detailed description and the accompanying drawings, in which.

DESCRIPTION OF PREFERRED EMBODIMENTS

Figure 1:
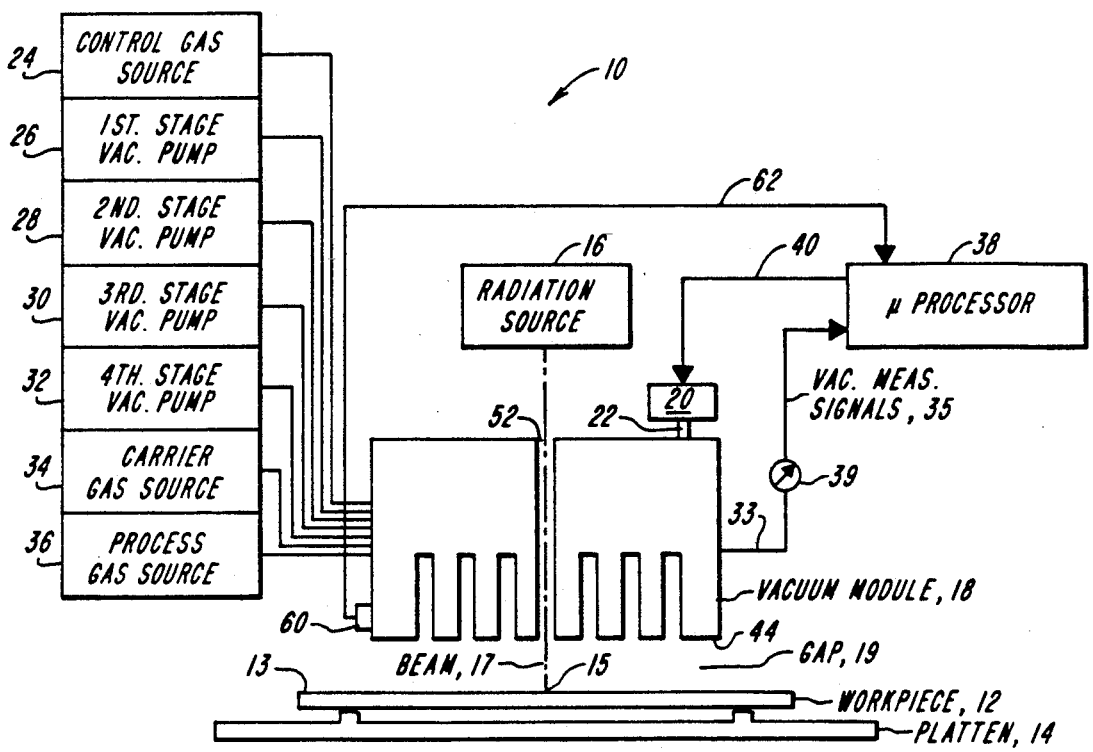
FIG. 1 is a schematic diagram, partly in block form, depicting a localized vacuum system in accordance with the invention.

FIG. 1 depicts vacuum apparatus 10 in accordance with the invention, for generating a localized, non-contact vacuum seal at a selected process region 15 of the surface 13 of a workpiece 12. The vacuum seal apparatus 10 is useful in repair and etching processes, such as repairing the workpiece 12 with a laser or other particle- or energy-beam 17 (hereinafter generically referred to as an "energy beam"). The workpiece 12 can be, for example, an LCD panel, and the workpiece 12 can be supported on a conventional platen 14.

The illustrated vacuum apparatus 10 includes a vacuum module 18 having a grooved workpiece-facing surface 44, and a set of conventional vacuum pump modules 26, 28, 30, 32 coupled to the grooves in vacuum module 18 by a plurality of conduits 50, for differentially evacuating the grooves of vacuum module 18 in a manner discussed in greater detail below in connection with FIG. 5.

Vacuum pump modules 26, 28, 30, 32 can include separate vacuum pumps, or can be collectively incorporated into a single vacuum pump having a plurality of ports. While FIG. 1 depicts four vacuum module stages, the invention can be practiced in connection with more or fewer vacuum module stages. The vacuum apparatus 10 can also include control gas module 24, carrier gas source 34, and process gas source 36, connected to vacuum module 18 by conduits 50, for supplying selected gases to vacuum module 18, as explained in further detail below in connection with FIG. 5.

In operation, the workpiece-facing surface 44 of vacuum module 18 is positioned over a selected process region 15 of the workpiece surface 13, and positioned in proximity with the workpiece surface 13 to attain a selected gap 19 in the Z-axis—i.e., the axis normal to the workpiece surface 13. Vacuum pump modules 26, 28, 30, and 32 are activated, to evacuate the grooves of vacuum module 18. A noncontact vacuum seal is thereby generated between the workpiece-facing surface 44 of vacuum module 18 and the selected process region 15 of the workpiece surface 13.

When a selected vacuum is attained in the vicinity of the process region 15—as measured by a conventional vacuum monitor 39, coupled via conduit 33 to vacuum module 18—the radiation source 16 can be activated to generate a beam 17. The beam 17 can be focused or otherwise positioned by conventional means, for transmission through bore 52 of vacuum module 18 onto the process region 15 of workpiece surface 13. The radiation source and beam positioning elements, can include a laser or other energy- or particle-beam source.

As depicted in FIG. 1, the vacuum apparatus 10 can include an X-Y-Z actuator system 20, of conventional design, for actuating relative motion between the vacuum module 18 and the workpiece surface 13, in three orthogonal axes. The X-Y-Z actuator system 20 can be mechanically coupled to the vacuum module 18 by linkage 22. Alternatively, the X-Y-Z actuator system 20 can be coupled to the platen 14. The actuator system 20, in turn, can be controlled by a microprocessor or other controller 38, responsive to vacuum measurement signals 35, in a manner discussed below in connection with FIG. 5. The actuator system 20 can, for example, actuate movement of the selected process site 15 at rates of 1 micron/sec - 2 millimeters/sec.

Figure 2:
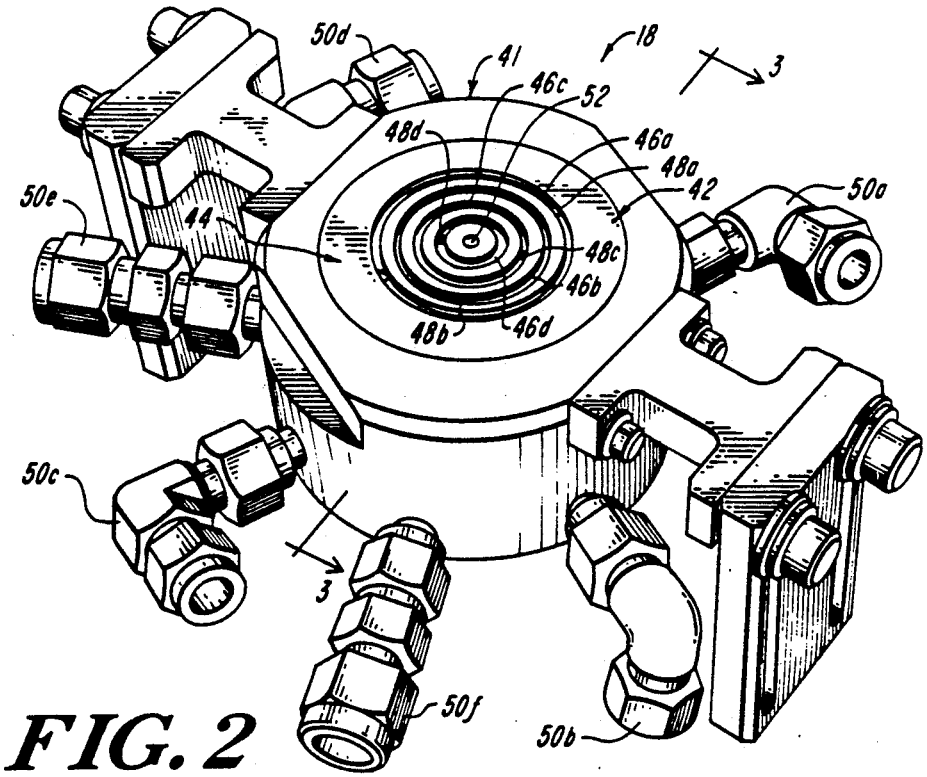
FIG. 2 depicts a differentially pumped vacuum apparatus in accordance with the invention, showing a vacuum body and a vacuum body housing.
Figure 4:
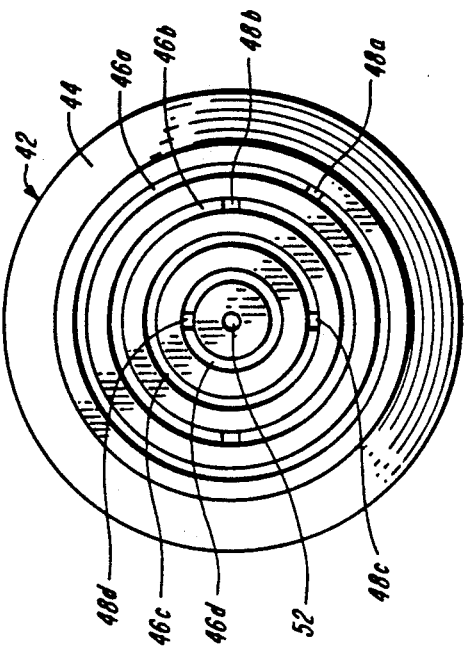
FIG. 4 is a bottom view of the vacuum body of FIG. 2.
Figure 3:
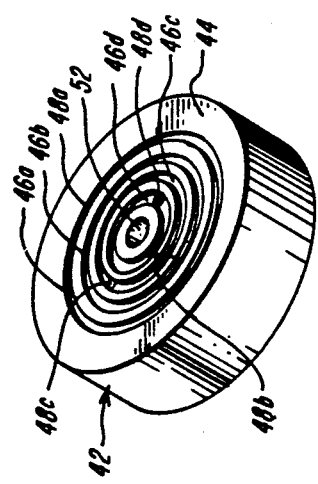
FIG. 3 is a side view of the vacuum body of FIG. 2.

The structure of vacuum module 18 is further illustrated by FIG. 2, which shows an embodiment of the invention in which vacuum module 18 consists primarily of two components—a vacuum body housing 41 and a substantially cylindrical vacuum body 42 fitted within the vacuum body housing 41. The vacuum body 42 depicted in FIGS. 2-4 has a central bore 52 for admitting radiation from source 16 (FIG. 1), and a workpiece-facing surface 44 with a set of non-intersecting circumferential grooves 46a–d. The vacuum body 42 depicted in FIGS. 2-4 is substantially cylindrical in form, with a selected radius, and workpiece-facing surface 44 is a substantially planar region in which grooves 46a–d can be formed.

Grooves 46a–d contain gas ports 48a–d, respectively, which communicate with conduits 50a–d incorporated into vacuum body housing 41. Vacuum modules 26, 28, 30, 32 can thereby evacuate grooves 46a–d, respectively, via conduits 50a–d and ports 48a–d, respectively. The grooves 46a–d accordingly define evacuated chambers for generating a localized vacuum at a selected process region of a workpiece.

The grooves 46a–d can be substantially circular and substantially concentric with the bore 52. Moreover, the vacuum body 42 can be advantageously constructed by machining grooves into the surface of a monolithic metallic body, and the ports can be constructed by machining respective bores through the vacuum body into the grooves. Constructing the vacuum body 42 from a monolithic body in this manner is preferable to multiple-element construction, in that it enhances compactness and provides efficient control of mechanical tolerances —such as flatness of workpiece-facing surface 44 and vacuum chamber size—while reducing cost.

A typical diameter for the vacuum body 42 is in the range of 10 to 50 millimeters. A radius of 25 millimeters or less is preferred in order to permit the maintenance of vacuum proximate to the edges or corners of a workpiece. While the illustrated vacuum body 42 is substantially cylindrical in form, other configurations can be utilized in accordance with the invention.

Referring once more to FIG. 2, the vacuum body housing 41 also includes conduits 50e–f for connection to selected gas sources 24, 34, 36 (FIG. 1). In a preferred embodiment of the invention, the control, carrier, and process gases from sources 24, 34, 36, respectively, can be admitted via port 48a to a selected vacuum body groove, such as the outermost groove 46a of vacuum body 42, as shown in FIG. 5.

Figure 5:
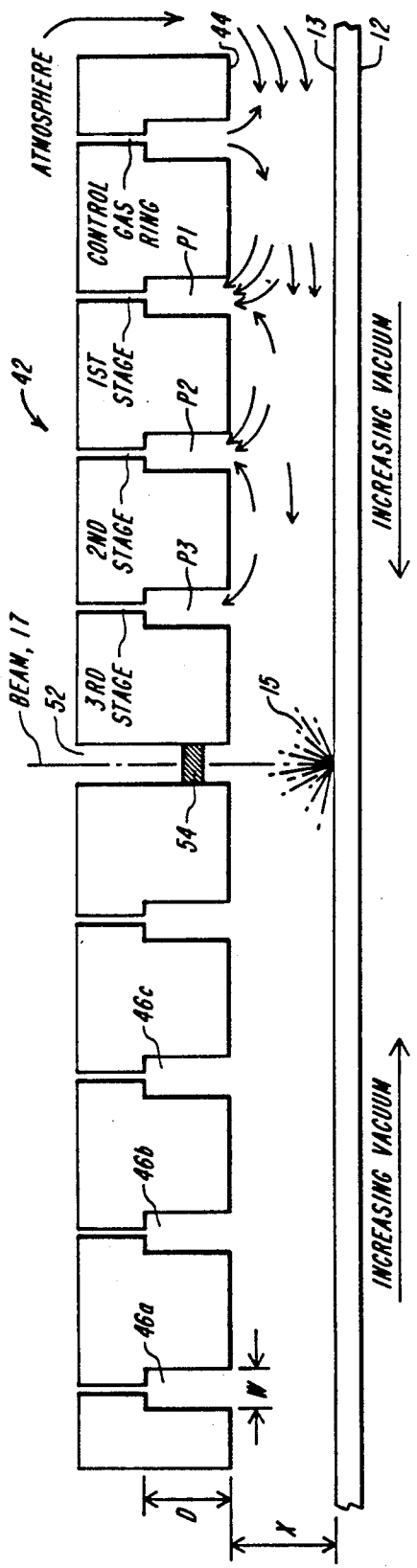
FIG. 5 is a simplified sectional view of the differentially pumped vacuum body of FIG. 2 taken along line 3—3.

Referring now to FIGS. 1 and 5, in operation, grooves 46b–d are differentially evacuated so that gas pressure P2 in groove 46c is lower than gas pressure P1 in groove 46b, and gas pressure P3 in the innermost groove 46d is lower than gas pressure P2 in the intermediate groove 46b, whereby the grooves define differentially pumped evacuated chambers which reduce the influx of atmospheric particles to the process region 15.

In this preferred embodiment of the invention, groove 46a of vacuum body 42 is utilized for the introduction of a selected control gas from control gas source 24 (FIG. 1), to further reduce the influx of atmospheric particles to the process region 15. The control gas can be an inert gas such as nitrogen. The utilization of a control gas has been found to enhance the isolation of the process region from the atmosphere. In particular, the utilization of a control gas in accordance with the invention has been demonstrated to minimize infiltration of atmospheric contaminants such as vacuum pump oil particles into the process region, which contaminants might otherwise be manifested in the form of oil rings deposited on the workpiece surface.

An apparatus constructed in accordance with the invention has been shown to provide effective vacuum isolation of the process region, utilizing evacuation of three concentric vacuum grooves to pressures P1, P2, and P3 of approximately 200, 40 and 8 Torr, respectively; a typical aspect ratio of groove depth (D) to width (W) of 10:1; a typical gap dimension (X) of approximately 0.002 inch; and a typical control gas flow rate of approximately 28,000 cubic centimeters/minute. These values are presented as examples only, and different values can be utilized in accordance with the invention.

Those skilled in the art will appreciate that in the configuration illustrated in FIG. 5, the level of vacuum generated by the vacuum body 42 is in part a function of the gap 19 between the workpiece-facing surface 44 and the workpiece surface 13 in the Z-axis—i.e., the axis normal to the workpiece surface. A preferred embodiment of the invention therefore includes feedback elements for automatically controlling the Z-axis position of the vacuum body 42 with respect to the workpiece surface 13, by monitoring the level of vacuum generated by vacuum body 42. Conversely, vacuum levels can be controlled by controlling the Z-axis position of the workpiece with respect to the vacuum body 42, to vary the gap 19.

In particular, as shown in FIG. 1, vacuum monitor 39 can be coupled to a selected zone in vacuum module 18—typically the innermost groove—by a conduit 33. The vacuum monitor 39, which can include a conventional vacuum gauge, generates vacuum measurement signals 35 representative of vacuum levels generated by vacuum module 18, and thus representative of the Z-axis gap 19 between workpiece-facing surface 44 and the workpiece surface 13.

Position control of vacuum module 18 can be provided by microprocessor 38, which reads vacuum measurement signals 35 and asserts Z-axis control signals 40 to X-Y-Z actuator module 20 to maintain a selected Z-axis gap 19 between the workpiece-facing surface 44 and the workpiece surface 13. The microprocessor 38 can be of conventional design and construction, programmed in accordance with known engineering practice. Moreover, while FIG. 1 depicts a microprocessor 38 for controlling the X-Y-Z actuator module 20, the invention can be practiced in connection with other digital or analog control circuits or computational devices.

Alternatively, the Z-axis dimension of gap 19 can be controlled in response to direct measurement of gap 19 by a conventional gap-monitoring element 60, shown in FIG. 1. The gap-monitoring element 60 can include a mechanical, capacitive, optical or other conventional displacement-measuring device, for generating gap signals 62 representative of the Z-axis dimension of gap 19. Microprocessor 38 can read the gap signals 62 generated by gap-monitoring element 60, and assert Z-axis control signals 40 to X-Y-Z actuator module 20 for maintaining a selected gap 19 between the workpiece-facing surface 44 and the workpiece surface 13.

Automatically controlling the Z-axis dimension of the gap between the workpiece-facing surface 44 and the workpiece surface 13 provides a number of significant advantages. In particular, automatic Z-axis control permits a selected minimum gap to be maintained, consistent with the avoidance of physical contact between the workpiece-facing surface 44 and the workpiece surface 13. Maintaining a minimum gap, in turn, maximizes vacuum while reducing the pumping rates required for maintaining vacuum, thereby increasing operational throughput and minimizing the cost and complexity of pumping equipment.

Referring again to FIGS. 1 and 5, a further preferred practice of the invention includes the introduction of a selected reactive gas mixture into the central bore 52 to migrate into, and react in, the path of the energy- or particle-beam 17. The reactive gas mixture can be a mixture of a process gas, supplied by process gas source 36, and a carrier gas, supplied by carrier gas source 34. The reactive gas mixture can be one which reacts with the beam 17 to cause selected etching of the process region 15, or one which reacts with the beam 17 to deposit a selected reaction product at the process region 15 of the workpiece surface 13.

Thus, for example, the invention can be practiced in connection with a laser source, and the reactive component can be selected to react photolytically, pyrolytically, or by a combination of both mechanisms, in the path of the laser beam. Suitable photolytically reactive materials, for example, include compounds having organic and metallic components. These materials can be photodecomposed by a focused laser beam, resulting in the dissociation of the organic component from the metallic component, and the deposition of the metallic component on the workpiece surface. Alternatively, pyrolytically reactive materials can be dissociated due to local heating by the focused laser beam. The components deposited on the workpiece surface can be either electrically conductive or insulative, and can be either optically opaque or transparent, depending upon the selected process gas and carrier gas components.

A laser beam having a characteristic wavelength in the range of approximately 200 nanometers to approximately 700 nanometers, and a power of approximately 1 milliwatt to 2 watts, can be used to photolytically or pyrolytically dissociate the selected reactive gas mixture. A transparent window 54, constructed of glass or other suitable material, can be employed in bore 52 to prevent plating of the objective lens of the laser focusing system (not shown) by the reaction products. The utilization of a window 54 eliminates the requirement of sealing the objective lens, and permits independent mounting of the laser objective lens with respect to the vacuum module 18 (FIG. 1), thereby facilitating movement of the objective lens for adjusting the focus of the laser system.

The selected process gas mixture can include, for example, cobalt carbonyl or tungsten carbonyl as a reactive component, and carbon monoxide or argon as a carrier. Cobalt carbonyl is preferred over tungsten carbonyl, because the tungsten compound requires higher temperatures for dissociation and deposition, leading to observable loss of existing conductor material.

Thus, for example, the process gas mixture can be introduced at a flow rate of approximately 10 cubic centimeters/minute, and a selected control gas can be introduced at a flow rate of approximately 28,000 cubic centimeters/minute. In particular, a process gas mixture, including cobalt carbonyl [$Co(CO_4)_2$] and a carbon monoxide [$CO$] carrier component in a selected ratio, can be introduced into the vacuum body 42 for reacting with the laser beam to deposit electrically conductive or insulative cobalt layers. These cobalt layers can be used for "writing" conductive or insulative lines to correct circuit defects in devices such as LCD panels. Writing can be executed in accordance with the invention by successive laser heating at contiguous sites. The illustrated vacuum apparatus advantageously permits rapid writing by maintaining a selected vacuum at the process site while translating across the X-Y plane defined by the workpiece surface 13. Translation rates can range between 1 micron/second and 2 millimeters/second. In addition, when deposition or etching is terminated, the carrier gas can be employed to purge the process region of reactive gas. Alternatively, the control gas can be utilized for this purpose.

Cobalt deposits were generated by the invention under a variety of experimental conditions, as illustrated in the following examples.

EXAMPLE 1

Reflective metallic films of cobalt were grown on a substrate by scanning the substrate with a focused laser beam in conjunction with the above-described vacuum apparatus. The process region was isolated using the differentially pumped vacuum apparatus having a workpiece-facing surface radius of approximately 25 millimeters, operating at a gap of approximately 50 microns from the surface of the substrate. A process gas mixture, containing a cobalt carbonyl reactive component and an argon carrier component, was introduced at a pressure of approximately 20 to 70 torr, with a cobalt carbonyl partial pressure of approximately 0.1 Torr.

EXAMPLE 2

Electrically insulative, optically transparent lines of cobalt oxide were drawn on a substrate, by employing the physical configuration described in Example 1 and introducing a process gas containing oxygen, cobalt carbonyl, and a carbon monoxide carrier component, at a pressure of approximately 20 Torr. The utilization of a carbon monoxide component has been found to prevent the formation of black crystals of a cobalt compound, while high rates of cobalt oxide deposition were obtained by utilizing the oxygen feed.

It will thus be seen that the invention efficiently attains the objects set forth above, among those made apparent from the preceding description. In particular, the invention provides apparatus and methods for efficiently isolating a selected process region of a workpiece from atmospheric particles, and for introducing selected process gases to the process region.

It will be understood that changes may be made in the above construction and in the foregoing sequences of operation without departing from the scope of the invention. Thus, for example, more or fewer vacuum stages can be utilized, and different reaction and carrier components can be employed. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. Apparatus positionable in proximity to a workpiece surface, for generating a localized, non-contact vacuum seal at a selected region of the workpiece surface and for processing the workpiece, the apparatus comprising
- a vacuum body having a workpiece-facing surface, said workpiece-facing surface including a periphery, a central region, and a plurality of non-intersecting circumferential grooves, said plurality of grooves including at least an outermost groove adjacent said periphery and an innermost groove adjacent said central region, said vacuum body further including a bore passing through said central region for permitting an energy beam to pass through said vacuum body to the workpiece surface,
- differential pumping means, in gas communication with said grooves, for evacuating said grooves so that gas pressure in said innermost groove is lower than gas pressure in said outermost groove, whereby said grooves define differentially pumped evacuated chambers reducing influx of atmospheric particles to said central region,
- control gas means, in gas communication with a selected groove, for introducing a selected inert control gas into said selected groove to further reduce said influx of atmospheric particles to said central region, and
- reaction gas means for introducing a selected reactive gas mixture into said central region to migrate into, and react in, the path of the energy beam, to produce a selected reaction at the selected region of the workpiece surface at which the localized vacuum seal is generated, said control gas substantially preventing contamination of said reaction by said atmospheric particles.

2. Apparatus according to claim 1 wherein said reactive gas mixture includes a reactive component for reacting in the path of the energy beam to cause selected etching of the workpiece surface.

3. Apparatus according to claim 1 wherein said reactive gas mixture includes a reactive component for reacting in the path of the energy beam to deposit a selected reaction product on the workpiece surface.

4. Apparatus according to claim 2 wherein said reactive component is photolytically reactive in the path of the energy beam.

5. Apparatus according to claim 2 wherein said reactive component is pyrolytically reactive in the path of the energy beam.

6. Apparatus according to claim 2 wherein said reactive-gas mixture further includes a carrier component.

7. Apparatus according to claim 6 wherein said carrier component contains carbon monoxide.

8. Apparatus according to claim 3 wherein said reactive component is photolytically reactive in the path of the energy beam.

9. Apparatus according to claim 3 wherein said reactive component is pyrolytically reactive in the path of the energy beam.

10. Apparatus according to claim 3 wherein said reaction product is substantially opaque.

11. Apparatus according to claim 3 wherein said reactive product is substantially electrically conductive.

12. Apparatus according to claim 3 wherein said reaction product is electrically insulative.

13. Apparatus according to claim 3 wherein said reactive gas mixture further includes a carrier component.

14. Apparatus according to claim 10 wherein said reactive component includes cobalt carbonyl.

15. Apparatus according to claim 14 wherein said reactive component further includes oxygen.

16. Apparatus according to claim 15 wherein said reaction product includes cobalt oxide.

17. Apparatus according to claim 11 wherein said reaction product is substantially transparent.

18. Apparatus according to claim 13 wherein said carrier component contains carbon monoxide.

19. A method for generating a localized, non-contact vacuum seal at a selected region of a workpiece surface and for processing the workpiece, the method comprising the steps of
- positioning, in selected proximity with the workpiece surface, a vacuum body having a workpiece-facing surface including a periphery, a central region, and a plurality of non-intersecting circumferential grooves with at least an outermost groove adjacent said periphery and an innermost groove adjacent said central region,
- differentially evacuating said grooves so that said grooves define differentially evacuated chambers reducing influx of atmospheric particles to said central region,
- introducing a selected inert control gas into a selected groove to further reduce said influx of atmospheric particles to said central region,
- directing an energy beam through said vacuum body to the workpiece surface, and
- introducing a selected reactive gas mixture into said central region to migrate into, and react in, the path of the energy beam, to produce a selected reaction at the selected region of the workpiece surface at which the localized vacuum seal is generated, said control gas substantially preventing contamination of said reaction by said atmospheric particles.

20. A method according to claim 19 wherein said step of introducing a reactive gas mixture includes the step of introducing a reactive component for reacting in the path of the energy beam to cause selected etching of the workpiece surface.

21. A method according to claim 19 wherein said step of introducing a reactive gas mixture includes the step of introducing a reactive component for reacting in the path of the energy beam to deposit a selected reaction product on the workpiece surface.

22. A method according to claim 21 wherein said step of introducing a reactive component includes the step of introducing a component which is photolytically reactive in the path of the energy beam.

23. A method according to claim 20 wherein said step of introducing a reactive component includes the step of introducing a component which is pyrolytically reactive in the path of the energy beam.

24. A method according to claim 20 wherein the step of introducing a reactive gas mixture includes the step of introducing a carrier component.

25. A method according to claim 24 wherein the step of introducing a carrier component includes the step of introducing a carbon monoxide component.

26. A method according to claim 21 wherein said step of introducing a reactive component includes the step of introducing a component which is photolytically reactive in the path of the energy beam.

27. A method according to claim 21 wherein said step of introducing a reactive component includes the step of introducing a component which is pyrolytically reactive in the path of the energy beam.

28. A method according to claim 21 wherein said step of introducing a reactive component includes the step of introducing a component which reacts in the path of the energy beam to deposit a reaction product which is substantially opaque.

29. A method according to claim 21 wherein said step of introducing a reactive component includes the step of introducing a component which reacts in the path of the energy beam to deposit a reaction product which is substantially electrically conductive.

30. A method according to claim 21 wherein said step of introducing a reactive component includes the step of introducing a component which reacts in the path of the energy beam to deposit a reaction product which is electrically insulative.

31. A method according to claim 21 wherein the step of introducing a reactive gas mixture includes the step of introducing a carrier component.

32. A method according to claim 28 wherein said step of introducing a reactive component includes the step of introducing cobalt carbonyl.

33. A method according to claim 32 wherein said step of introducing a reactive component includes the step of introducing oxygen.

34. A method according to claim 29 wherein said step of introducing a reactive component includes the step of introducing a component which reacts in the path of the energy beam to deposit a reaction product which is substantially transparent.

35. A method according to claim 31 wherein the step of introducing a carrier component includes the step of introducing a carbon monoxide component.

36. A method for generating a localized, non-contact vacuum seal at a selected region of a workpiece surface, the method comprising the steps of positioning, in selected proximity with the workpiece surface, a vacuum body having a workpiece-facing surface including a periphery, a central region, and a plurality of non-intersecting circumferential grooves with at least an outermost groove adjacent said periphery and an innermost groove adjacent said central region, differentially evacuating said grooves so that said grooves define differentially evacuated chambers reducing influx of atmospheric particles to said central region, introducing a selected inert control gas into a selected groove to further reduce said influx of atmospheric particles to said central region, directing an energy beam through said vacuum body to the workpiece surface, introducing a selected reactive gas mixture into said central region to migrate into, and react in, the path of the energy beam, said step of introducing a selected reactive gas mixture including the step of introducing a reactive component for reacting in the path of the energy beam to deposit a selected reaction product on the workpiece surface, wherein said step of introducing a reactive component includes the step of introducing cobalt carbonyl, and inhibiting deposition of black crystals containing cobalt.

37. A method according to claim 36 wherein said step of inhibiting deposition of black crystals includes the step of introducing carbon monoxide.

* * * * *